United States Patent
Cranford, Jr. et al.

(10) Patent No.: US 7,042,277 B2
(45) Date of Patent: May 9, 2006

(54) CIRCUIT AND METHOD FOR REDUCING JITTER IN A PLL OF HIGH SPEED SERIAL LINKS

(75) Inventors: Hayden C. Cranford, Jr., Cary, NC (US); Stacy J. Garvin, Durham, NC (US); Vernon R. Norman, Cary, NC (US); Todd M. Rasmus, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/685,022

(22) Filed: Oct. 14, 2003

(65) Prior Publication Data

US 2005/0077936 A1    Apr. 14, 2005

(51) Int. Cl.
*G01F 1/10* (2006.01)
(52) U.S. Cl. .................................... 327/538; 331/185
(58) Field of Classification Search ........... 327/530, 327/538–540, 156, 147; 331/1 R, 10, 17, 331/185
See application file for complete search history.

(56) References Cited

U.S. PATENT DOCUMENTS

| | | | |
|---|---|---|---|
| 5,343,167 A | 8/1994 | Masumoto et al. ............ 331/2 |
| 5,422,603 A | 6/1995 | Soyuer ........................ 331/1 A |
| 5,463,352 A * | 10/1995 | Chen ........................... 331/1 R |
| 5,495,207 A | 2/1996 | Novof .......................... 331/57 |
| 5,650,754 A * | 7/1997 | Joshi et al. ................. 331/36 C |
| 5,783,972 A | 7/1998 | Nishikawa ................... 331/17 |
| 5,807,003 A | 9/1998 | Kobayashi et al. ......... 400/625 |
| 5,903,195 A | 5/1999 | Lukes et al. .................... 331/4 |
| 5,959,502 A * | 9/1999 | Ovens et al. ................... 331/8 |
| 6,097,244 A * | 8/2000 | Chen ........................... 327/553 |
| 6,292,061 B1 | 9/2001 | Qu ............................... 331/17 |
| 6,977,558 B1 * | 12/2005 | Cranford et al. ............ 331/186 |
| 2003/0080817 A1 * | 5/2003 | Ishii ............................. 331/17 |

* cited by examiner

*Primary Examiner*—Minh Nguyen
(74) *Attorney, Agent, or Firm*—Sawyer Law Group LLP

(57) ABSTRACT

Aspects for reducing jitter in a PLL of a high speed serial link include examining at least one parameter related to performance of a voltage controlled oscillator (VCO) in the PLL, and controlling adjustment of a supply voltage to the VCO based on the examining. A regulator control circuit performs the examining and controlling.

20 Claims, 3 Drawing Sheets

Table 1: REGVHI and REGOVR_OUT Mapping

| REGVHI | REGOVR_OUT | Regulator Voltage |
|---|---|---|
| 0 | 0 | 1.1V |
| 0 | 1 | 1.2V |
| 1 | 0 | not allowed |
| 1 | 1 | 1.3V |

If at any time REGOVER_IN = '1' then
    REGVHI = '0', REGOVR_OUT = '1', COMPDIS = '1', and BLOCK_PLLLOCK = '0'.
Else
    After reset or power up:
        REGVHI = '1', REGOVR_OUT = '1', COMPDIS = '0', and BLOCK_PLLLOCK = '1'.
    Wait 150 us.
    Sample (VCTLOK ended with internal PLL_LOCK indicator).
    If VCTLOK_SAMPLE = '1' then
        REGVHI = '1', REGOVR_OUT = '1', COMPDIS = '0', and BLOCK_PLLLOCK = '0'.
        Stop. Keep outputs the same until next reset.
    Else
        REGVHI = '0', REGOVR_OUT = '0', COMPDIS = '0', and BLOCK_PLLLOCK = '1'.
    Wait 150 us.
    Sample (VCTLOK ended with internal PLL_LOCK indicator).
    If VCTLOK_SAMPLE = '1' then
        REGVHI = '0', REGOVR_OUT = '0', COMPDIS = '1', and BLOCK_PLLLOCK = '0'.
        Stop. Keep outputs the same until next reset.
    Else
        REGVHI = '0', REGOVR_OUT = '0', COMPDIS = '1', and BLOCK_PLLLOCK = '1'.
        Stop. Keep outputs the same until next reset.
    End if

FIG. 3

CIRCUIT AND METHOD FOR REDUCING JITTER IN A PLL OF HIGH SPEED SERIAL LINKS

FIELD OF THE INVENTION

The present invention relates to jitter reduction in phase-locked loops of high speed serial links.

BACKGROUND OF THE INVENTION

The ability to perform and achieve high speed transmissions of digital data has become expected in today's computing environment. In most cases, the transmission of digital data over longer distances is accomplished by sending the data in a high-speed serial format (i.e., one single bit after another) over a communication link designed to handle computer communications. In this fashion, data can be transferred from one computer system to another, even if the computer systems are geographically remote.

In order for high-speed serial transmission to occur, the digital data signal from inside the computer must be transformed from the parallel format into a serial format prior to transmission of the data over the serial communication link. This transformation is generally accomplished by processing the computer's internal data signal through a piece of computer equipment known as a serial link transmitter or "serializer". The function of the serializer is to receive a parallel data stream as input and, by manipulating the parallel data stream, output a serial form of the data capable of high-speed transmission over a suitable communication link. Once the serialized data has arrived at the desired destination, a piece of computer equipment known as a "deserializer" is employed to convert the incoming data from the serial format to a parallel format for use within the destination computer system.

For high speed serializer/deserializer (HSS) link pairs, a phase-locked loop (PLL) is used to get a phase lock based on the incoming signal. A basic block diagram of a typical PLL is illustrated in FIG. 1. The PLL includes a phase/frequency detector (PD) 10 coupled to a charge pump (CP) 12, which is coupled to a voltage controlled oscillator (VCO) 14. A regulator (REG) 16 is included for the PLL circuitry to supply a filtered/regulated version of the supply voltage (Vcc) to the VCO 14. The PD 10 compares the phase (FREQout) of the VCO 14 signal filtered through a frequency divider (DIV) 18 with that of the incoming signal (FREQin) and adjusts the control voltage (Vcntrl) to keep the VCO 14 in phase with the incoming signal.

In general, maintaining the control voltage of the VCO within a certain range helps in reducing jitter. Prior art approaches have designed the VCO/control voltage with a fixed high gain to cover the range. In an alternative design, the regulator output voltage can be set to set the power supply voltage that the VCO sees. While such approaches do address the jitter problem to a certain extent, they are limited against having the flexibility to more readily address jitter across a broad range of variations in the incoming signal frequency.

Accordingly, a need exists for a manner of reducing jitter in PLLs of high speed serial links that accommodates variations in the incoming signal frequency. The present invention addresses such a need.

SUMMARY OF THE INVENTION

Aspects for reducing jitter in a PLL of a high speed serial link are described. The aspects include examining at least one parameter related to performance of a voltage controlled oscillator (VCO) in the PLL, and controlling adjustment of a supply voltage to the VCO based on the results. A regulator control circuit performs this examination and controls the resultant supply voltage to the PLL.

Through the present invention, jitter in a PLL is successfully reduced by examination of the parameters directly related to PLL performance without knowledge of absolutes in frequency from the reference clock or in operating frequency. Thus, a flexible and efficient approach to accommodating variations in the frequency of the incoming signal for a PLL of a high speed serial link is achieved. These and other advantages will become readily apparent from the following detailed description and accompanying drawings.

BRIEF DESCRIPTION OF THE DRAWINGS

FIG. 3 illustrates a logic table and pseudo-code for the decision logic of FIG. 2.

DETAILED DESCRIPTION

The present invention relates to jitter reduction in phase-locked loops of high speed serial links. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

In accordance with the present invention, a regulator control circuit for utilization with a PLL is provided. In general, the regulator control circuit maintains the control voltage of a VCO within certain boundaries deemed preferable for VCO operation while adjusting the regulator output seen by the VCO to mitigate certain noise effects. With the regulator control circuit, there are multiple levels of regulator output voltages under logic control, and the range of Vp and Vn control voltages for the VCO are limited while still achieving the required range of frequency operation.

Figure 1:
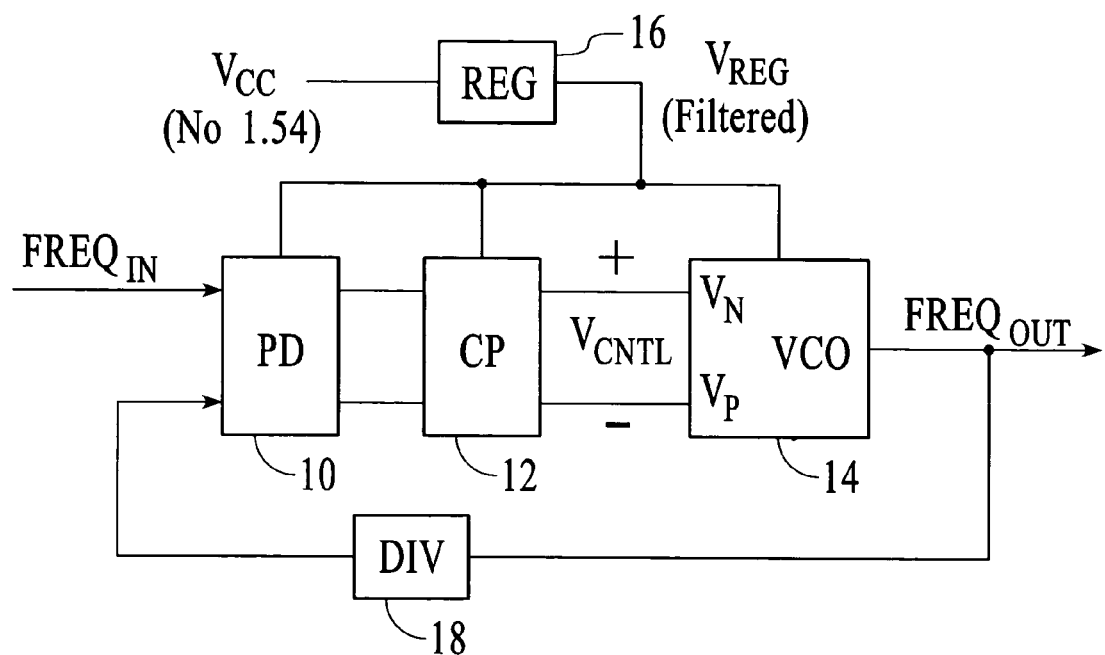
FIG. 1 illustrates a block diagram of a phase locked loop (PLL) of the prior art.
Figure 2:
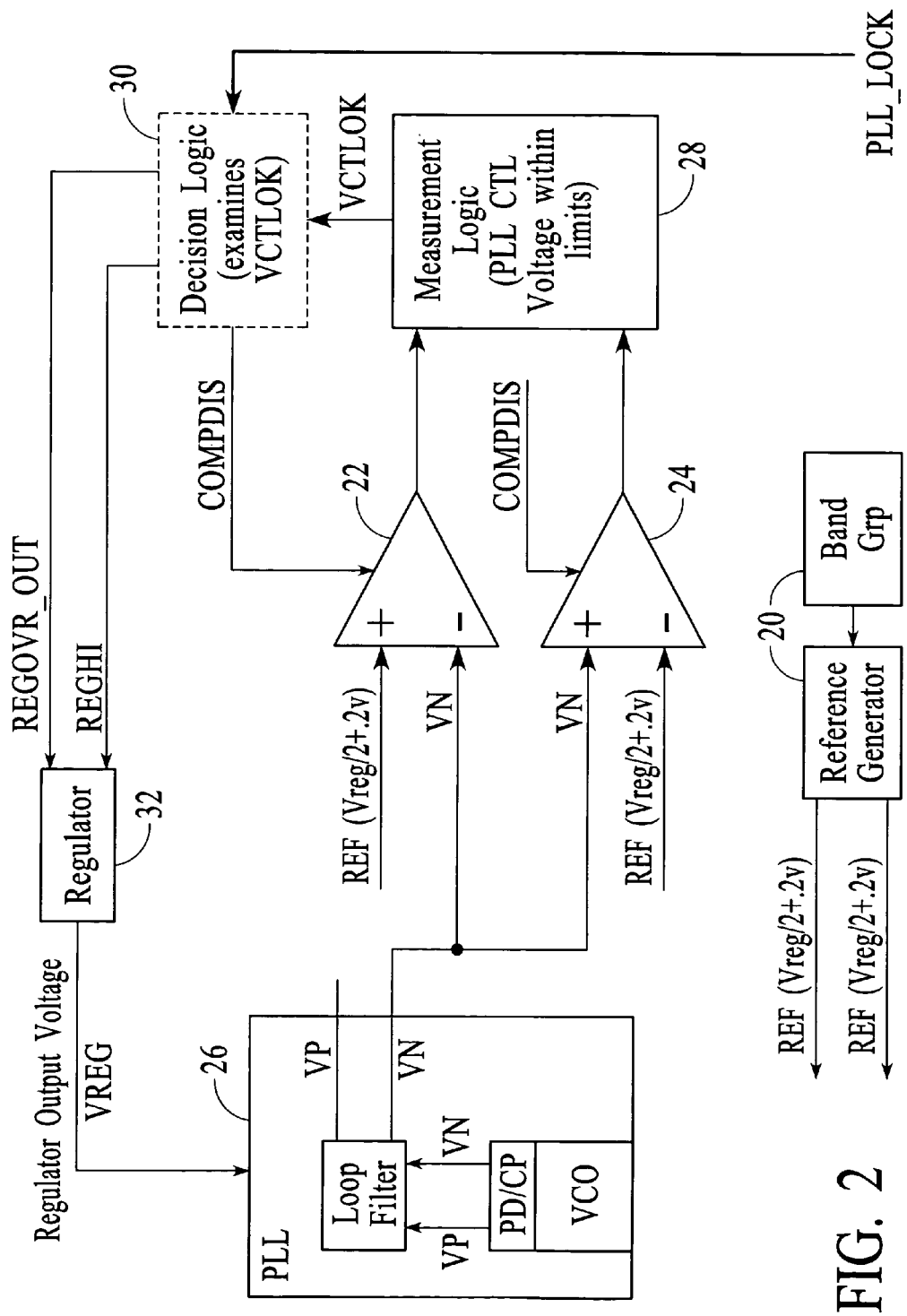
FIG. 2 illustrates a circuit diagram for a regulator control circuit in accordance with the present invention.

Referring to the circuit diagram of FIG. 2, a regulator control circuit in accordance with the present invention is illustrated. As shown, the regulator control circuit includes a band gap-based voltage reference generator 20 having two voltage settings. It should be appreciated that although the following description refers to utilization of two regulator voltage settings, this is meant as illustrative and not restrictive of the number of regulator voltage settings that could be included. The output of the reference generator 20 is input to dual comparators 22, 24. The comparators 22, 24 further receive the control voltage of the PLL 26. With the control voltage being a differential signal, either the positive (Vp) or negative (Vn) version is suitable for comparison purposes. In the example embodiment, the negative version, Vn, is used.

The measurement logic 28 examines whether the control voltage (Vn) is within a predetermined allowable range. In a preferred embodiment, the predetermined range is based on limits deemed preferable for VCO operation, and as indicated by REF, is one-half of the regulator voltage plus/minus 200 millivolts (0.2 v). It has been found by the inventors that if the control voltage is within these limits, the VCO is operating in the portion of the gain curve in which jitter is lower than if this control voltage is allowed to be in excess of the limits. The level of Vctlok (control voltage okay) from the measurement logic 28 indicates whether the control voltage is within the limits.

The Vctlok signal is received by decision logic 30. Decision logic 30 performs two main functions. One function of the decision logic 30 is to examine the level of the PLL lock signal (PLL_LOCK). The PLL_LOCK signal is generated based on a reference clock and a clock from the PLL which should have the same frequency as the reference clock. Each clock is made to run a two bit counter, and the two counters are started at different values. The PLL_LOCK signal will be asserted if the two counters values are never equal to each other during a period of time determined by a time-out counter.

The second function of the decision logic 30 is to control the regulator voltage selection signals (REGOVR_OUT and REGHI) which go to the regulator 32. Although two selection signals are illustrated, this is meant as illustrative and not restrictive of the number of regulator voltage selection signals that can be used. The levels of the selection signals are determined based on the inputs of Vctlok and PLL_LOCK. FIG. 3 illustrates a table that indicates how the REGOVR_OUT and REGHI signals of the decision logic 30 correspond to the regulator 32 voltage setting and illustrates pseudo-code of the implementation steps performed by the decision logic 30 in producing the REGHI and REGOVR_OUT signals. In addition to those signals already indicated in FIG. 2, in the pseudo-code of FIG. 3, REGOVR_IN represents an override signal input (e.g., via a switch), BLOCK_PLLLOCK represents an internal logic signal that can block external knowledge of the PLL_LOCK signal information as needed during the performance of the process, and VCTLOK_SAMPLE represents the result of the "Sample" step shown.

As indicated by the psuedo-code, the decision logic 30 examines whether the control voltage is in the predetermined allowable range and determines if the PLL is locked. If both conditions are met, the regulator 32 is considered to be operating appropriately and is left in the startup condition. If either condition fails, the regulator 32 is moved to another output voltage value and again a check is made for appropriate operation. If the desired operation is achieved, then the outputs are kept the same until the next reset. If in all regulator positions, a fail still exists, the PLL should experience increased jitter and be rejected.

Thus, jitter in a PLL is successfully reduced by examination of the parameters directly related to PLL performance without knowledge of absolutes in frequency from the reference clock or in operating frequency; i.e., jitter is managed based on the differential VCO control voltage's distance from its optimum. By managing jitter in this manner, performance is readily improved and design variations readily accommodated in a straightforward and efficient manner.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

What is claimed is:

1. A circuit for reducing jitter in a high speed serial link, the circuit comprising:
   a phase-locked loop (PLL), the PLL comprising a voltage controlled oscillator (VCO);
   a regulator coupled to the PLL to provide a supply voltage to the PLL; and
   a regulator control circuit coupled to the PLL and to the regulator for examining at least one parameter related to performance of the VCO, including a VCO control voltage, and for controlling adjustments of the supply voltage based on the examination.

2. The circuit of claim 1 wherein the regulator control circuit further determines if the VCO control voltage is within a predetermined range of optimum operation.

3. The circuit of claim 2 wherein the regulator control circuit further examines a lock status of the PLL.

4. The circuit of claim 3 wherein when the VCO control voltage is within the predetermined range and the PLL is locked, no adjusting of the supply voltage is done.

5. The circuit of claim 4 wherein when the VCO control voltage is not within the predetermined range or the PLL is not locked, the supply voltage is adjusted.

6. The circuit of claim 5 wherein the regulator control circuit further controls selection of a voltage level output from the regulator.

7. The circuit of claim 1 wherein the regulator control circuit comprises a band gap-based reference generator coupled to comparator logic, the comparator logic coupled to measurement logic, and decision logic coupled to the measurement logic and to the comparator logic.

8. A regulator control circuit for reducing jitter in a high speed serial link, the circuit comprising:
   decision logic for examining at least one parameter related to performance of a voltage controlled oscillator (VCO) in a phase-locked loop (PLL), including a VCO control voltage, comparator logic coupled to the decision logic for comparing the VCO control voltage to predetermined voltage levels, and controlling adjustments of a supply voltage to the VCO based on the examining.

9. The regulator control circuit of claim 8 further comprising a band gap-based reference generator for establishing the predetermined voltage levels.

10. The regulator control circuit of claim 8 further comprising measurement logic coupled to the comparator logic for measuring an output of the comparator logic against a predetermined range of optimum operation and providing an indicator signal to the decision logic.

11. The regulator control circuit of claim 10 wherein the decision logic further examines a lock status of the PLL.

12. The regulator control circuit of claim 11 wherein when the decision logic determines that the VCO control voltage is within the predetermined range based on the indicator signal and that the PLL is locked based on the lock status, no adjusting of the supply voltage is done.

13. The regulator control circuit of claim 12 wherein when the decision logic determines that VCO control voltage is not within the predetermined range or the PLL is not locked, the supply voltage is adjusted.

14. The regulator control circuit of claim 8 wherein the decision logic further controls selection of a voltage level output of a regulator supplying voltage to the VCO.

15. A method for reducing jitter in a phase-locked loop (PLL) of a high speed serial link, the method comprising:
   (a) examining at least one parameter related to performance of a voltage controlled oscillator (VCO) in the PLL, including a VCO control voltage; and
   (b) controlling adjustment of a supply voltage to the VCO based on the examining.

16. The method of claim 15 wherein the examining step (a) further comprises determining if the VCO control voltage is within a predetermined range of optimum operation.

17. The method of claim 16 wherein the examining step (a) further comprises examining a lock status of the PLL.

18. The method of claim 17 wherein when the VCO control voltage is within the predetermined range and the PLL is locked, no adjusting of the supply voltage is done.

19. The method of claim 18 wherein when the VCO control voltage is not within the predetermined range or the PLL is not locked, the supply voltage is adjusted.

20. The method of claim 15 wherein controlling step (b) further comprises
   controlling selection of a voltage level output of a regulator supplying voltage to the VCO.

* * * * *